United States Patent
Lin et al.

(10) Patent No.: US 11,533,021 B1
(45) Date of Patent: Dec. 20, 2022

(54) DOWN-CONVERSION MIXER

(71) Applicant: National Chi Nan University, Nantou (TW)

(72) Inventors: Yo-Sheng Lin, Puli (TW); Kai-Siang Lan, Puli (TW)

(73) Assignee: NATIONAL CHI NAN UNIVERSITY, Nantou (TW)

( * ) Notice: Subject to any disclaimer, the term of this patent is extended or adjusted under 35 U.S.C. 154(b) by 0 days.

(21) Appl. No.: 17/528,307

(22) Filed: Nov. 17, 2021

(30) Foreign Application Priority Data

Aug. 16, 2021 (TW) .................................. 110130158

(51) Int. Cl.
*H03D 7/14* (2006.01)
*H03D 3/00* (2006.01)
*H04B 1/10* (2006.01)

(52) U.S. Cl.
CPC ........... *H03D 3/007* (2013.01); *H03D 7/1441* (2013.01); *H03D 7/1466* (2013.01); *H04B 1/109* (2013.01)

(58) Field of Classification Search
CPC .......... H03D 3/007; H03D 7/125; H03D 7/14; H03D 7/1425; H03D 7/1441; H03D 7/1458; H03D 7/1466; H03D 7/1483; H04B 1/109
See application file for complete search history.

(56) References Cited

U.S. PATENT DOCUMENTS 10,630,270 B1 * 4/2020 Lin ...................... H03K 5/1252
10,651,794 B1 * 5/2020 Lin ...................... H03D 7/1441

* cited by examiner

*Primary Examiner* — Long Nguyen
(74) *Attorney, Agent, or Firm* — Birch, Stewart, Kolasch & Birch, LLP (57) ABSTRACT

A down-conversion mixer includes a converting-and-mixing circuit and a load circuit. The converting-and-mixing circuit performs voltage to current conversion and mixing with a differential oscillatory voltage signal pair upon a differential input voltage signal pair to generate a differential mixed current signal pair. The load circuit includes two transistors each having a transconductance that varies according to a control voltage, two resistors each decreasing a threshold voltage of a respective one of the transistors, and a resistor-inductor circuit cooperating with the transistors to convert the differential mixed current signal pair into a differential mixed voltage signal pair.

13 Claims, 7 Drawing Sheets

DOWN-CONVERSION MIXER

CROSS-REFERENCE TO RELATED APPLICATION

This application claims priority of Taiwanese Patent Application No. 110130158, filed on Aug. 16, 2021.

FIELD

The disclosure relates to a mixer, and more particularly to a down-conversion mixer with a variable conversion gain.

BACKGROUND

Figure 1:
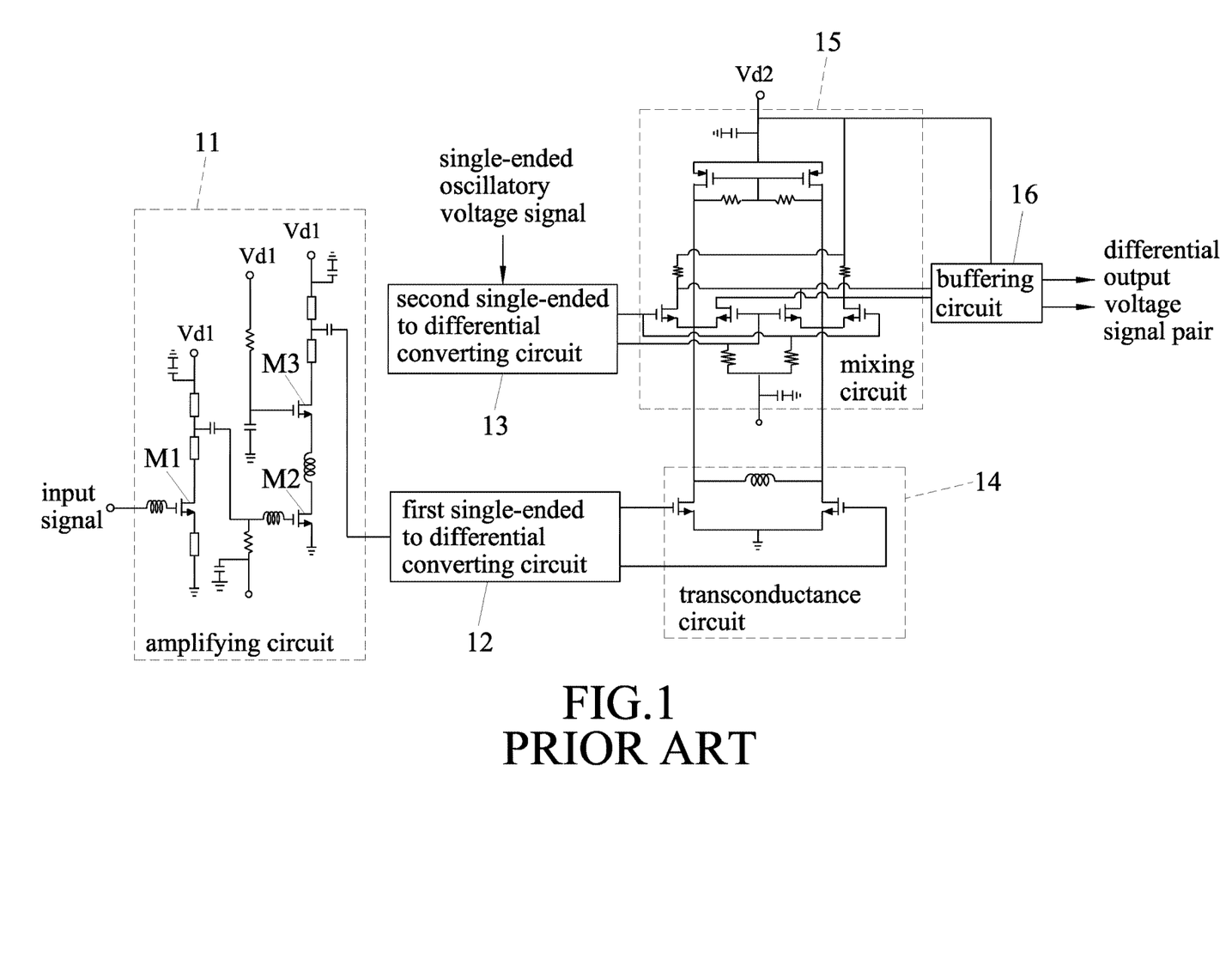
FIG. 1 is a circuit block diagram illustrating a conventional down-conversion mixer.

Referring to FIG. 1, a conventional down-conversion mixer includes an amplifying circuit 11, a first single-ended to differential converting circuit 12, a second single-ended to differential converting circuit 13, a transconductance circuit 14, a mixing circuit 15 and a buffering circuit 16.

The amplifying circuit 11 amplifies an input signal of radio frequency into a single-ended input voltage signal. The first single-ended to differential converting circuit 12 converts the single-ended input voltage signal into a differential input voltage signal pair. The second single-ended to differential converting circuit 13 converts a single-ended oscillatory voltage signal into a differential oscillatory voltage signal pair. The transconductance circuit 14 converts the differential input voltage signal pair into a differential input current signal pair. The mixing circuit 15 mixes the differential input current signal pair with the differential oscillatory voltage signal pair to generate a differential mixed voltage signal pair of intermediate frequency. The buffering circuit 16 buffers the differential mixed voltage signal pair to generate a differential output voltage signal pair.

Parameters (e.g., resistances, capacitances, inductances, transconductances, etc.) of all elements of the conventional down-conversion mixer are fixed, so a conversion gain of the conventional down-conversion mixer is fixed. In addition, the conversion gain of the conventional down-conversion mixer is low, and a noise figure of the conventional down-conversion mixer is high, so power supply voltages (Vd1, Vd2) for powering the conventional down-conversion mixer have to be large, resulting in high power consumption of the conventional down-conversion mixer.

SUMMARY

Therefore, an object of the disclosure is to provide a down-conversion mixer with a variable conversion gain.

According to the disclosure, the down-conversion mixer includes a converting-and-mixing circuit and a load circuit. The converting-and-mixing circuit is to receive a differential input voltage signal pair and a differential oscillatory voltage signal pair, and performs voltage to current conversion upon the differential input voltage signal pair and mixes the differential input voltage signal pair with the differential oscillatory voltage signal pair, so as to generate a differential mixed current signal pair. The load circuit has a first terminal and a second terminal that are coupled to the converting-and-mixing circuit to cooperatively receive the differential mixed current signal pair, and converts the differential mixed current signal pair into a differential mixed voltage signal pair that is provided at the first and second terminals of the load circuit. The load circuit includes a first transistor, a second transistor, a first resistor, a second resistor and a resistor-inductor (RL) circuit. Each of the first and second transistors has a first terminal that is to receive a power supply voltage, a second terminal that is coupled to a respective one of the first and second terminals of the load circuit, a third terminal, a control terminal that is to receive a control voltage, and a transconductance that varies according to the control voltage. Each of the first and second resistors is coupled between the second and third terminals of a respective one of the first and second transistors. The RL circuit is coupled between the second terminals of the first and second transistors.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, each current signal may have a positive magnitude or a negative magnitude, with the positive and negative magnitudes indicating opposite directions of the current signal. For example, when a component receives a current signal with a positive magnitude, the current signal flows into the component; and when the component receives a current signal with a negative magnitude, the current signal flows out of the component. Moreover, it should be noted that throughout the drawings, the direction of each current signal is shown by a corresponding arrow.

Figure 2:
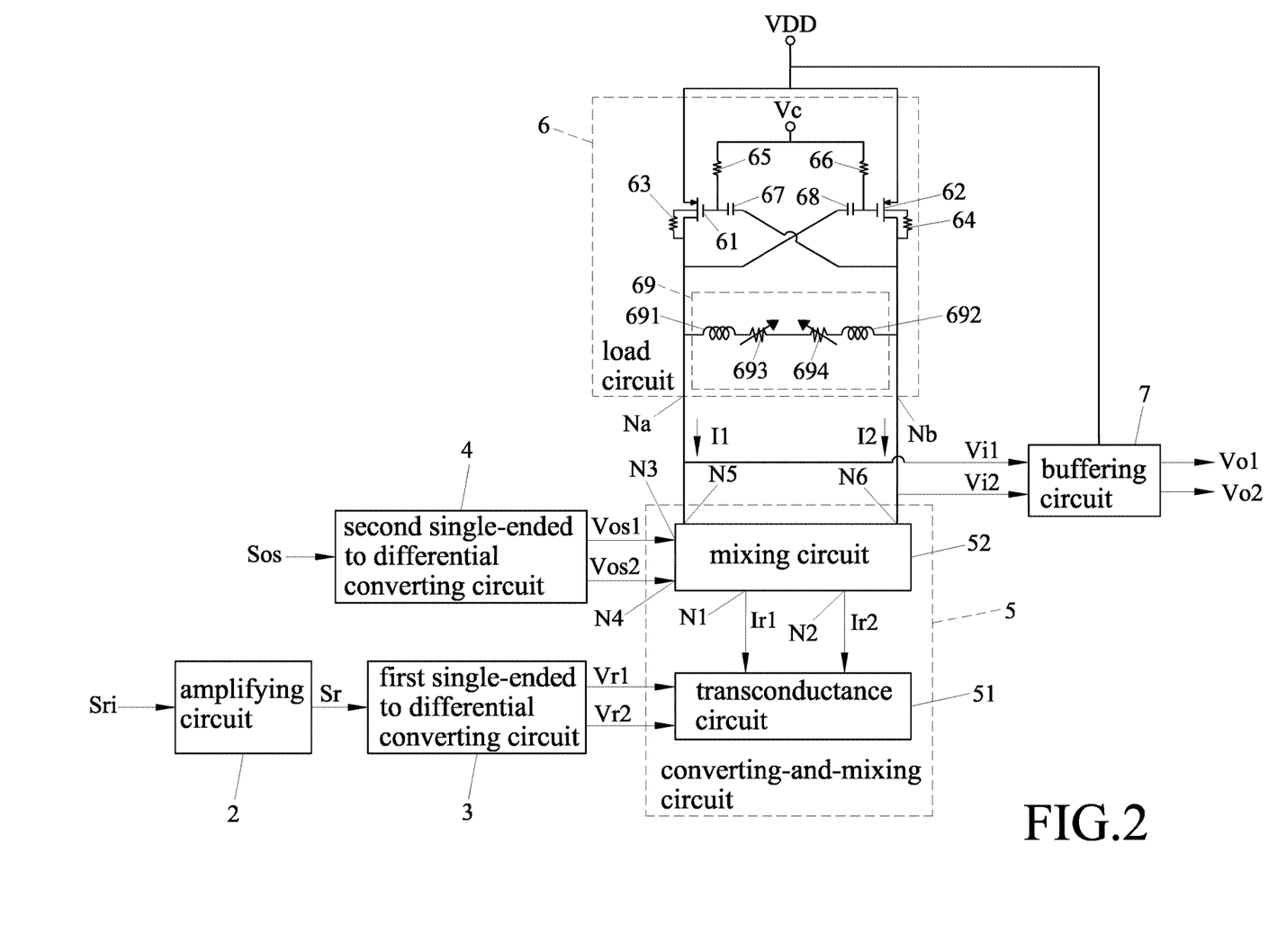
FIG. 2 is a circuit block diagram illustrating an embodiment of a down-conversion mixer according to the disclosure.
Figure 3:
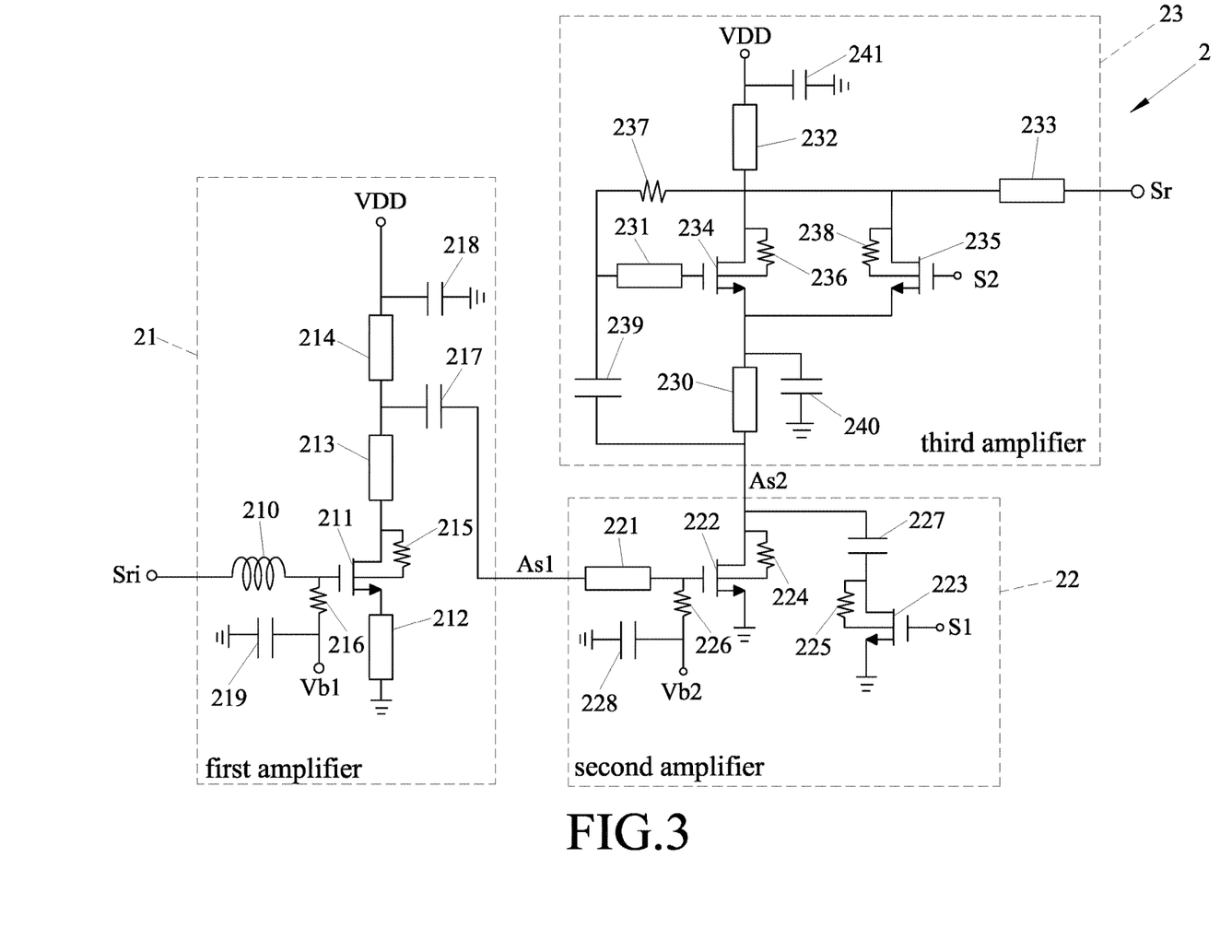
FIG. 3 is a circuit diagram illustrating an amplifying circuit of the embodiment.
Figure 4:
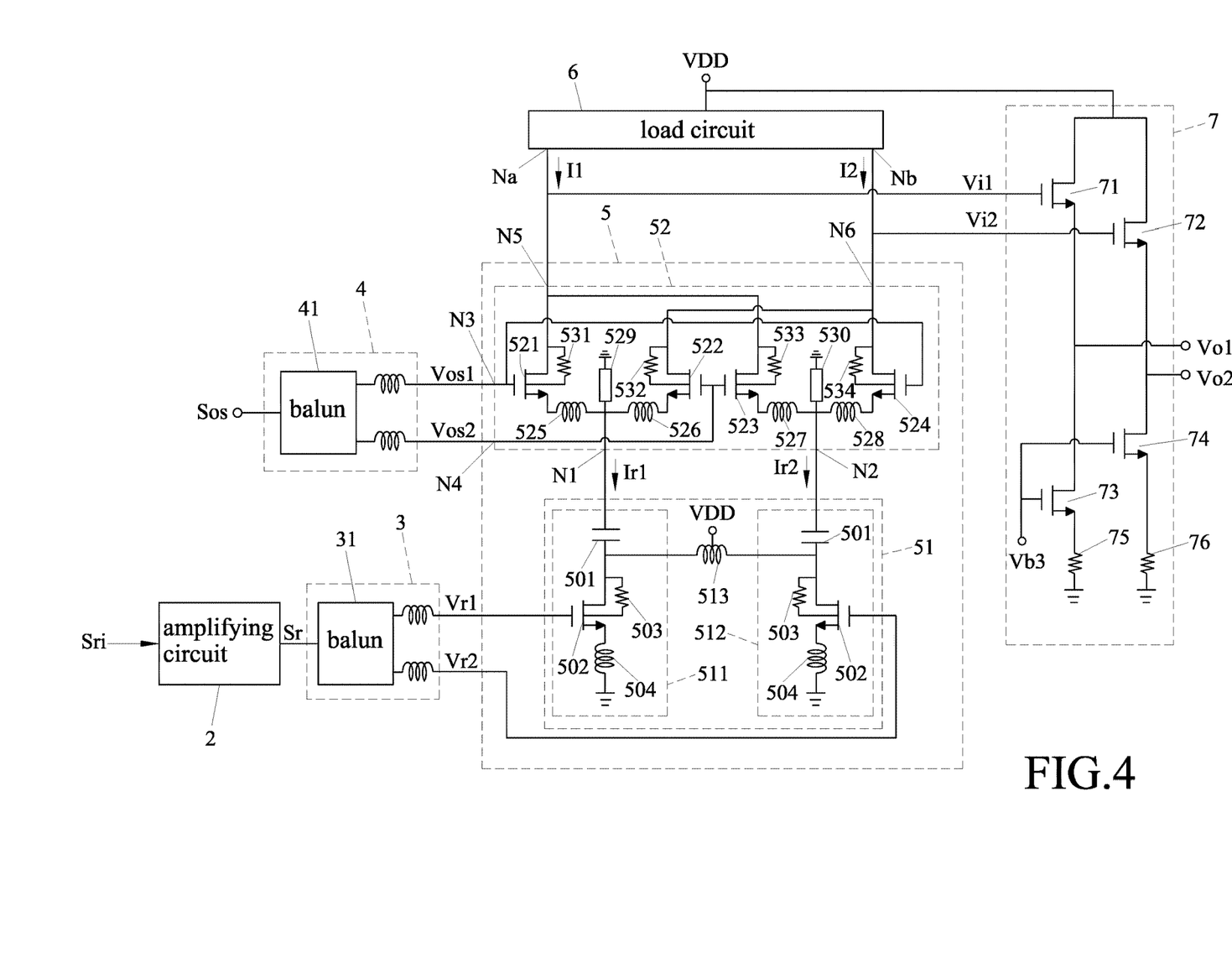
FIG. 4 is a circuit block diagram illustrating a first single-ended to differential converting circuit, a second single-ended to differential converting circuit, a converting-and-mixing circuit and a buffering circuit of the embodiment.

Referring to FIGS. 2, 3 and 4, an embodiment of a down-conversion mixer according to the disclosure includes an amplifying circuit 2, a first single-ended to differential converting circuit 3, a second single-ended to differential converting circuit 4, a converting-and-mixing circuit 5, a load circuit 6 and a buffering circuit 7.

The amplifying circuit 2 is to receive an input signal (Sri) of, for example, radio frequency, and amplifies the input signal (Sri) to generate a single-ended input voltage signal (Sr).

The first single-ended to differential converting circuit 3 is coupled to the amplifying circuit 2 to receive the single-ended input voltage signal (Sr), and converts the single-ended input voltage signal (Sr) into a differential input voltage signal pair (Vr1, Vr2) that includes a first input voltage signal (Vr1) and a second input voltage signal (Vr2).

The second single-ended to differential converting circuit 4 is to receive a single-ended oscillatory voltage signal (Sos), and converts the single-ended oscillatory voltage signal (Sos) into a differential oscillatory voltage signal pair (Vos1, Vos2) that includes a first oscillatory voltage signal (Vos1) and a second oscillatory voltage signal (Vos2).

The converting-and-mixing circuit 5 is coupled to the first single-ended to differential converting circuit 3 to receive the differential input voltage signal pair (Vr1, Vr2), and is further coupled to the second single-ended to differential converting circuit to receive the differential oscillatory voltage signal pair (Vos1, Vos2). The converting-and-mixing circuit 5 performs voltage to current conversion upon the differential input voltage signal pair (Vr1, Vr2) and mixes the differential input voltage signal pair (Vr1, Vr2) with the differential oscillatory voltage signal pair (Vos1, Vos2), so as to generate a differential mixed current signal pair (I1, I2) that includes a first mixed current signal (I1) and a second mixed current signal (I2) and that is of, for example, intermediate frequency.

The load circuit 6 has a first terminal (Na) and a second terminal (Nb) that are coupled to the converting-and-mixing circuit 5 to cooperatively receive the differential mixed current signal pair (I1, I2), and converts the differential mixed current signal pair (I1, I2) into a differential mixed voltage signal pair (Vi1, Vi2) that is provided at the first and second terminals (Na, Nb) of the load circuit (6) and that includes a first mixed voltage signal (Vi1) and a second mixed voltage signal (Vi2).

The buffering circuit 7 is coupled to the first and second terminals (Na, Nb) of the load circuit 6 to receive the differential mixed voltage signal pair (Vi1, Vi2), and buffers the differential mixed voltage signal pair (Vi1, Vi2) to generate a differential output voltage signal pair (Vo1, Vo2) that includes a first output voltage signal (Vo1) and a second output voltage signal (Vo2).

In an example where the input signal (Sri) has a frequency of 94 GHz, and where the single-ended oscillatory voltage signal (Sos) has a frequency of 93.9 GHz, the differential output voltage signal pair (Vo1, Vo2) has a frequency of 0.1 GHz.

In this embodiment, as shown in FIG. 3, the amplifying circuit 2 includes a first amplifier 21, a second amplifier 22 and a third amplifier 23. The first amplifier 21 is to receive the input signal (Sri), and amplifies the input signal (Sri) to generate a first amplified signal (As1). The second amplifier 22 is coupled to the first amplifier 21 to receive the first amplified signal (As1), and amplifies the first amplified signal (As1) to generate a second amplified signal (As2). The third amplifier 23 is coupled to the second amplifier 22 to receive the second amplified signal (As2), and amplifies the second amplified signal (As2) to generate the single-ended input voltage signal (Sr).

In this embodiment, as shown in FIG. 3, the first amplifier 21 includes an inductor 210, a transistor 211, three inductive transmission lines 212, 213, 214, two resistors 215, 216 and three capacitors 217, 218, 219. The resistor 216 has a first terminal that is to receive a bias voltage (Vb1), and a second terminal. The inductor 210 has a first terminal that is to receive the input signal (Sri), and a second terminal that is coupled to the second terminal of the resistor 216 to receive the bias voltage (Vb1) through the resistor 216. The transistor 211 has a first terminal, a second terminal, a third terminal, and a control terminal that is coupled to the second terminal of the inductor 210. The inductive transmission line 212 is coupled between the second terminal of the transistor 211 and ground. The inductive transmission line 213 has a first terminal, and a second terminal that is coupled to the first terminal of the transistor 211. The inductive transmission line 214 has a first terminal that is to receive a power supply voltage (VDD), and a second terminal that is coupled to the first terminal of the inductive transmission line 213. The resistor 215 is coupled between the first and third terminals of the transistor 211. The capacitor 217 has a first terminal that is coupled to the first terminal of the inductive transmission line 213, and a second terminal that provides the first amplified signal (As1). The capacitor 218 is coupled between the first terminal of the inductive transmission line 214 and ground. The capacitor 219 is coupled between the first terminal of the resistor 216 and ground.

In this embodiment, as shown in FIG. 3, the second amplifier 22 includes an inductive transmission line 221, two transistors 222, 223, three resistors 224, 225, 226 and two capacitors 227, 228. The resistor 226 has a first terminal that is to receive a bias voltage (Vb2), and a second terminal. The inductive transmission line 221 has a first terminal that is coupled to the second terminal of the capacitor 217 to receive the first amplified signal (As1), and a second terminal that is coupled to the second terminal of the resistor 226 to receive the bias voltage (Vb2) through the resistor 226. The transistor 222 has a first terminal that provides the second amplified signal (As2), a second terminal that is coupled to ground, a third terminal, and a control terminal that is coupled to the second terminal of the inductive transmission line 221. The capacitor 227 has a first terminal that is coupled to the first terminal of the transistor 222, and a second terminal. The transistor 223 has a first terminal that is coupled to the second terminal of the capacitor 227, a second terminal that is coupled to ground, a third terminal, and a control terminal that is to receive a control signal (S1). Each of the resistors 224, 225 is coupled between the first and third terminals of a respective one of the transistors 222, 223. The capacitor 228 is coupled between the first terminal of the resistor 226 and ground.

In this embodiment, as shown in FIG. 3, the third amplifier 23 includes four inductive transmission lines 230, 231, 232, 233, two transistors 234, 235, three resistors 236, 237, 238 and three capacitors 239, 240, 241. The inductive transmission line 230 has a first terminal, and a second terminal that is coupled to the first terminal of the transistor 222 to receive the second amplified signal (As2). The transistor 234 has a first terminal, a second terminal that is coupled to the first terminal of the inductive transmission line 230, a third terminal, and a control terminal. The inductive transmission line 231 has a first terminal, and a second terminal that is coupled to the control terminal of the transistor 234. The inductive transmission line 232 has a first terminal that is to receive the power supply voltage (VDD), and a second terminal that is coupled to the first terminal of the transistor 234. The inductive transmission line 233 has a first terminal that is coupled to the first terminal of the transistor 234, and a second terminal that provides the single-ended input voltage signal (Sr). The transistor 235 has a first terminal that is coupled to the first terminal of the transistor 234, a second terminal that is coupled to the first terminal of the inductive transmission line 230, a third terminal, and a control terminal that is to receive a control signal (S2). Each of the resistors 236, 238 is coupled between the first and third terminals of a respective one of the transistors 234, 235. The resistor 237 is coupled between the first terminal of the inductive transmission line 231 and the first terminal of the transistor 234. The capacitor 239 is coupled between the first terminal of the inductive transmission line 231 and the second terminal of the inductive transmission line 230. The capacitor 240 is coupled between the first terminal of the inductive transmission line 230 and ground. The capacitor 241 is coupled between the first terminal of the inductive transmission line 232 and ground.

It should be noted that, in this embodiment, a gain of the amplifying circuit 2 can be coarsely adjusted by switching the transistor 223 between conduction and non-conduction, and can be finely adjusted by changing a resistance provided by the transistor 235.

In this embodiment, as shown in FIG. 4, the first single-ended to differential converting circuit 3 includes a balun 31 (e.g., a Marchand balun or an elliptical balun) and other elements. The balun 31 has an input terminal that is coupled to the second terminal of the inductive transmission line 233 to receive the single-ended input voltage signal (Sr), a first output terminal that provides a voltage signal related to the first input voltage signal (Vr1), and a second output terminal that provides a voltage signal related to the second input voltage signal (Vr2).

Similarly, in this embodiment, as shown in FIG. 4, the second single-ended to differential converting circuit 4 includes a balun 41 (e.g., a Marchand balun or an elliptical balun) and other elements. The balun has an input terminal that is to receive the single-ended oscillatory voltage signal (Sos), a first output terminal that provides a voltage signal related to the first oscillatory voltage signal (Vos1), and a second output terminal that provides a voltage signal related to the second oscillatory voltage signal (Vos2).

In this embodiment, the converting-and-mixing circuit 5 includes a transconductance circuit 51 and a mixing circuit 52. The transconductance circuit 51 is coupled to the first single-ended to differential converting circuit 3 to receive the differential input voltage signal pair (Vr1, Vr2), and converts the differential input voltage signal pair (Vr1, Vr2) into a differential input current signal pair (Ir1, Ir2) that includes a first input current signal (Ir1) and a second input current signal (Ir2). The mixing circuit 52 is coupled to the second single-ended to differential converting circuit 4 to receive the differential oscillatory voltage signal pair (Vos1, Vos2), and is further coupled to the transconductance circuit 51 to receive the differential input current signal pair (Ir1, Ir2). The mixing circuit 52 mixes the differential input current signal pair (Ir1, Ir2) with the differential oscillatory voltage signal pair (Vos1, Vos2) to generate the differential mixed current signal pair (I1, I2).

In this embodiment, as shown in FIG. 4, the transconductance circuit 51 includes a first transconductance unit 511, a second transconductance unit 512 and an inductor 513. The first transconductance unit 511 is coupled to the first single-ended to differential converting circuit 3 to receive the first input voltage signal (Vr1), and converts the first input voltage signal (Vr1) into the first input current signal (Ir1). Likewise, the second transconductance unit 512 is coupled to the first single-ended to differential converting circuit 3 to receive the second input voltage signal (Vr2), and converts the second input voltage signal (Vr2) into the second input current signal (Ir2). The inductor 513 has two end terminals that are respectively coupled to the first and second transconductance units 511, 512, and a central terminal that is to receive the power supply voltage (VDD).

To be specific, in this embodiment, the first input current signal (Ir1) is in-phase with the first input voltage signal (Vr1), the second input current signal (Ir2) is in-phase with the second input voltage signal (Vr2), and each of the first and second transconductance units 511, 512 includes a capacitor 501, a transistor 502, a resistor 503 and an inductor 504. For each of the first and second transconductance units 511, 512, the capacitor 501 has a first terminal that provides a corresponding one of the first and second input current signals (Ir1, Ir2), and a second terminal that is coupled to a corresponding one of the end terminals of the inductor 513; the transistor 502 has a first terminal that is coupled to the second terminal of the capacitor 501, a second terminal, a third terminal, and a control terminal that is coupled to the first single-ended to differential converting circuit 3 to receive a corresponding one of the first and second input voltage signals (Vr1, Vr2); the resistor 503 is coupled between the first and third terminals of the transistor 502; and the inductor 504 is coupled between the second terminal of the transistor 502 and ground.

In this embodiment, as shown in FIG. 4, the mixing circuit 52 has a first terminal (N1), a second terminal (N2), a third terminal (N3), a fourth terminal (N4), a fifth terminal (N5) and a sixth terminal (N6), where the first and second terminals (N1, N2) are respectively coupled to the first terminals of the capacitors 501 of the first and second transconductance units 511, 512 to respectively receive the first and second input current signals (Ir1, Ir2), the third and fourth terminals (N3, N4) are coupled to the second single-ended to differential converting circuit 4 to respectively receive the first and second oscillatory voltage signals (Vos1, Vos2), and the fifth and sixth terminals (N5, N6) respectively provide the first and second mixed current signals (I1, I2). In addition, the mixing circuit 52 includes four transistors 521, 522, 523, 524, four inductors 525, 526, 527, 528, two inductive transmission lines 529, 530 and four resistors 531, 532, 533, 534. The transistor 521 has a first terminal that is coupled to the fifth terminal (N5) of the mixing circuit 52, a second terminal, a third terminal, and a control terminal that is coupled to the third terminal (N3) of the mixing circuit 52. The transistor 522 has a first terminal that is coupled to the sixth terminal (N6) of the mixing circuit 52, a second terminal, a third terminal, and a control terminal that is coupled to the fourth terminal (N4) of the mixing circuit 52. The transistor 523 has a first terminal that is coupled to the fifth terminal (N5) of the mixing circuit 52, a second terminal, a third terminal, and a control terminal that is coupled to the fourth terminal (N4) of the mixing circuit 52. The transistor 524 has a first terminal that is coupled to the sixth terminal (N6) of the mixing circuit 52, a second terminal, a third terminal, and a control terminal that is coupled to the third terminal (N3) of the mixing circuit 52. Each of the inductors 525, 526 is coupled between the second terminal of a respective one of the transistors 521, 522 and the first terminal (N1) of the mixing circuit 52. Each of the inductors 527, 528 is coupled between the second terminal of a respective one of the transistors 523, 524 and the second terminal (N2) of the mixing circuit 52. Each of the inductive transmission lines 529, 530 is coupled between a respective one of the first and second terminals (N1, N2) of the mixing circuit 52 and ground. Each of the resistors 531-534 is coupled between the first and third terminals of a respective one of the transistors 521-524.

In this embodiment, as shown in FIG. 2, the first and second terminals (Na, Nb) of the load circuit 6 are respectively coupled to the fifth and sixth terminals (N5, N6) of the mixing circuit 52 to respectively receive the first and second mixed current signals (I1, I2), and respectively provide the first and second mixed voltage signals (Vi1, Vi2). In addition, the load circuit 6 includes two transistors 61, 62, four resistors 63, 64, 65, 66, two capacitors 67, 68 and a resistor-inductor (RL) circuit 69. Each of the resistors 65, 66 has a first terminal that is to receive a control voltage (Vc), and a second terminal. Each of the transistors 61, 62 has a first terminal that is to receive the power supply voltage (VDD), a second terminal that is coupled to a respective one of the first and second terminals (Na, Nb) of the load circuit 6, a third terminal, a control terminal that is coupled to the second terminal of a respective one of the resistors 65, 66 to receive the control voltage (Vc) through the respective one of the resistors 65, 66, and a transconductance that varies according to the control voltage (Vc). Each of the resistors 63, 64 is coupled between the second and third terminals of a respective one of the transistors 61, 62. The capacitor 67 is coupled between the control terminal of the transistor 61 and the second terminal of the transistor 62. The capacitor 68 is coupled between the control terminal of the transistor 62 and the second terminal of the transistor 61. The RL circuit 69 is coupled between the second terminals of the transistors 61, 62. To be specific, the RL circuit 69 includes two inductors 691, 692 and two variable resistors 693, 694. Each of the inductors 691, 692 has a first terminal that is coupled to the second terminal of a respective one of the transistors 61, 62, and a second terminal. The variable resistors 693, 694 are coupled in series between the second terminals of the inductors 691, 692.

In this embodiment, as shown in FIG. 4, the buffering circuit 7 includes four transistors 71, 72, 73, 74 and two resistors 75, 76. Each of the transistors 71, 72 has a first terminal that is to receive the power supply voltage (VDD), a second terminal, and a control terminal that is coupled to a respective one of the first and second terminals (Na, Nb) of the load circuit 6 to receive a respective one of the first and second mixed voltage signals (Vi1, Vi2). Each of the transistors 73, 74 has a first terminal that is coupled to the second terminal of a respective one of the transistors 71, 72, a second terminal, and a control terminal that is to receive a bias voltage (Vb3). Each of the resistors 75, 76 is coupled between the second terminal of a respective one of the transistors 73, 74 and ground. Each of the first and second output voltage signals (Vo1, Vo2) is provided at the second terminal of a respective one of the transistors 71, 72.

In this embodiment, each of the transistors 211, 222, 223, 234, 235, 502, 521-524 is an N-type metal oxide semiconductor field effect transistor (nMOSFET) having a drain terminal, a source terminal, a bulk terminal and a gate terminal that respectively serve as the first, second, third and control terminals of the transistor; each of the transistors 71-74 is an nMOSFET having a drain terminal, a source terminal and a gate terminal that respectively serve as the first, second and control terminals of the transistor; and each of the transistors 61, 62 is a P-type metal oxide semiconductor field effect transistor (pMOSFET) having a source terminal, a drain terminal, a bulk terminal and a gate terminal that respectively serve as the first, second, third and control terminals of the transistor.

In this embodiment, when an angular frequency of the differential mixed current signal pair (I1, I2) is not high (e.g.,
within a range of from 0 Hz to 0.1 GHz), a load impedance ($Z_L$) of the load circuit 6 can be expressed by the following equation:

$$L = \frac{R_{693,694}}{\sqrt{(1 - g_{m61,62} \cdot R_{693,694})^2 + \{\omega_{IF} \cdot R_{693,694} \cdot [C_L - 1/(\omega_{IF}^2 \cdot L_{691,692})]\}^2}}$$

where "$R_{693,694}$" denotes a resistance of each of the variable resistors 693, 694, "$g_{m61,62}$" denotes the transconductance of each of the transistors 61, 62, "$\omega_{IF}$" denotes the angular frequency of the differential mixed current signal pair (I1, I2), "$C_L$" denotes a capacitance seen at the second terminal of each of the transistors 61, 62, and "$L_{691,692}$" denotes an inductance of each of the inductors 691, 692.

In this embodiment, since the resistance ($R_{693,694}$) of each of the variable resistors 693, 694 is variable, one can increase the resistance ($R_{693,694}$) of each of the variable resistors 693, 694 to increase the load impedance ($Z_L$) of the load circuit 6, thereby increasing a conversion gain of the down-conversion mixer and reducing a noise figure of the down-conversion mixer. In addition, since the transconductance ($g_{m61,62}$) of each of the transistors 61, 62 varies according to the control voltage (Vc), one can decrease the control voltage (Vc) to increase the transconductance ($g_{m61,62}$) of each of the transistors 61, 62, thereby increasing the load impedance ($Z_L$) of the load circuit 6, and thus increasing the conversion gain of the down-conversion mixer and reducing the noise figure of the down-conversion mixer. Moreover, when the angular frequency ($\omega_{IF}$) of the differential mixed current signal pair (I1, I2) is low (i.e., $\omega_{IF} \sim 0$), by properly designing the resistance ($R_{693,694}$) of each of the variable resistors 693, 694 and the transconductance ($g_{m61,62}$) of each of the transistors 61, 62 such that $1 - g_{m61,62} \cdot R_{693,694} \approx 0$, the load impedance ($Z_L$) of the load circuit 6 can be maximized.

Figure 5:
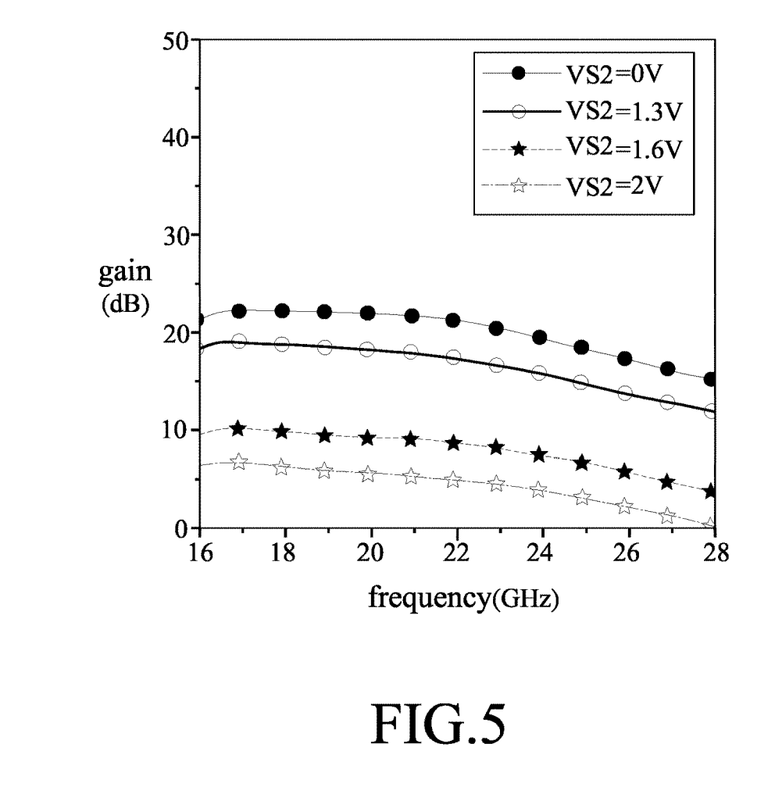
FIG. 5 is a plot illustrating gain versus frequency characteristic of the amplifying circuit when one of two transistors of the amplifying circuit does not conduct while the other one of the transistors is in various conditions.
Figure 6:
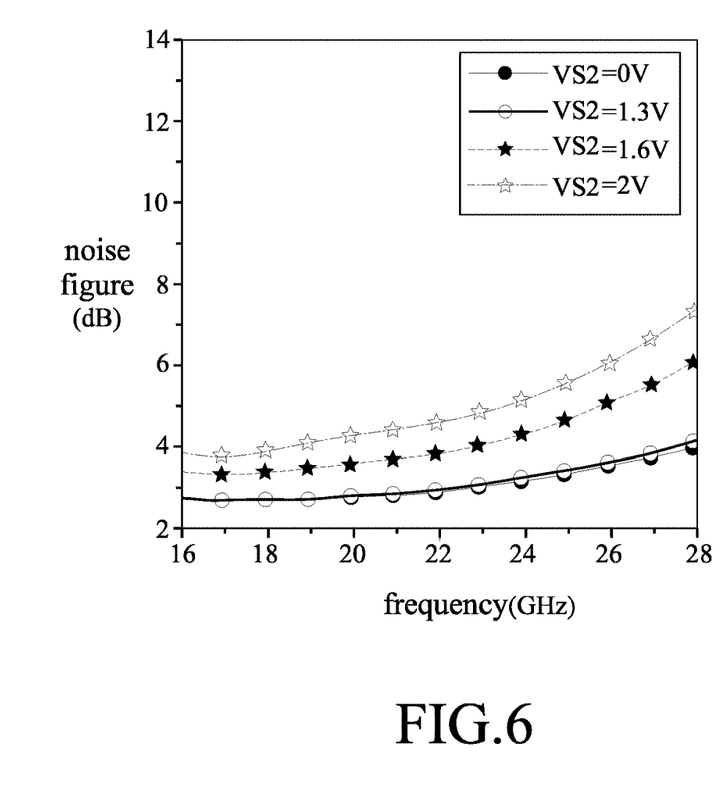
FIG. 6 is a plot illustrating noise figure versus frequency characteristic of the amplifying circuit when said one of the transistors does not conduct while said other one of the transistors is in various conditions.

Referring to FIGS. 3, 5 and 6, FIGS. 5 and 6 respectively illustrate simulated gain and simulated noise figure of the amplifying circuit 2 under a circumstance where a voltage of the control signal (51) is 0 V (i.e., the transistor 223 does not conduct), where a voltage (VS2) of the control signal (S2) is 0 V, 1.3 V, 1.6 V or 2 V (i.e., the transistor 235 is in one of four different conditions), and where the frequency of the input signal (Sri) is within a range of from 16 GHz to 28 GHz. At the zero voltage of the control signal (S1) and a specific value of the frequency of the input signal (Sri), when the voltage (VS2) of the control signal (S2) is 0 V, the transistor 235 does not conduct and provides an infinite resistance between the first and second terminals of the transistor 234, the gain of the amplifying circuit 2 is at its peak value, and the noise figure of the amplifying circuit 2 is at its valley value; when the voltage (VS2) of the control signal (S2) is 1.3 V, 1.6 V or 2 V, the transistor 235 conducts and provides a finite resistance between the first and second terminals of the transistor 234, the gain of the amplifying circuit 2 is below its peak value, and the noise figure of the amplifying circuit 2 is above its valley value; and as the voltage (VS2) of the control signal (S2) increases, the resistance provided by the transistor 235 decreases, the gain of the amplifying circuit 2 decreases, and the noise figure of the amplifying circuit 2 increases. When the voltage of the control signal (S1) is 0 V and the frequency of the input signal (Sri) is 20 GHz, the gain of the amplifying circuit 2 is within a range of from 5.5 dB to 22 dB, and the noise figure of the amplifying circuit 2 is within a range of from 2.8 dB to 4.3 dB. It can be reasonably determined from FIGS. 5 and 6 that, when the voltage of the control signal (S1) is 0 V and the voltage (VS2) of the control signal (S2) is 2 V, the gain of the amplifying circuit 2 is high, and the noise figure of the amplifying circuit 2 is low.

Figure 7:
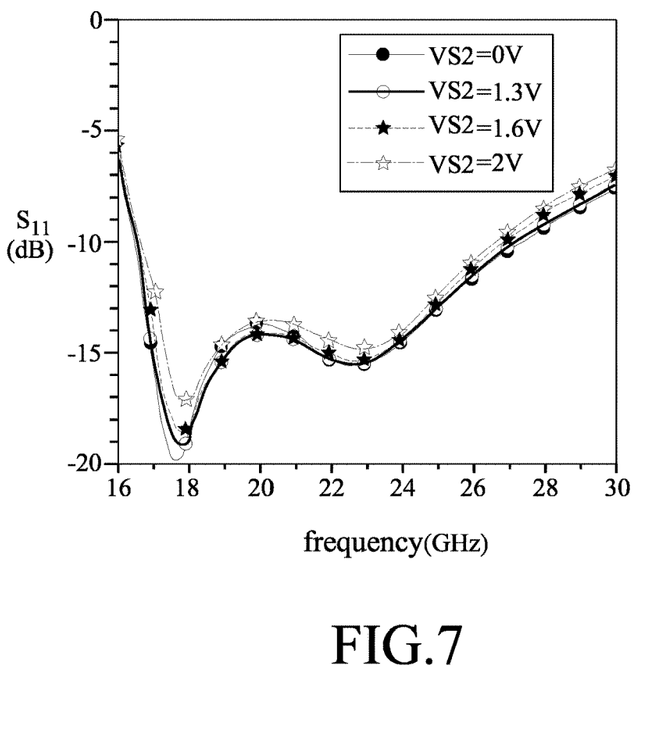
FIG. 7 is a plot illustrating reflection coefficient versus frequency characteristic of the amplifying circuit when said one of the transistors does not conduct while said other one of the transistors is in various conditions.

Referring to FIGS. 3 and 7, FIG. 7 illustrates simulated reflection coefficient ($S_{11}$) of the amplifying circuit 2 under the aforesaid circumstance. It can be reasonably determined from FIG. 7 that the condition of the transistor 235 hardly affects the reflection coefficient ($S_{11}$) of the amplifying circuit 2.

Figure 8:
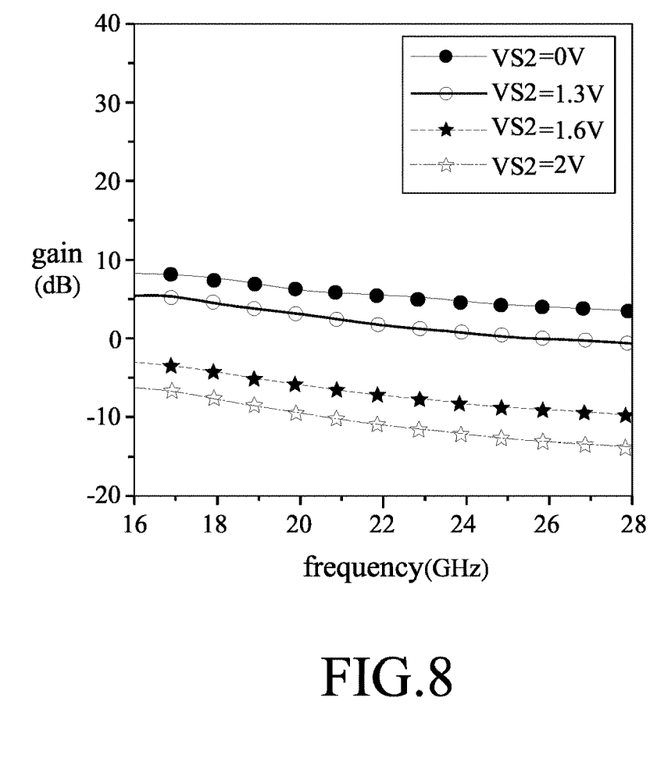
FIG. 8 is a plot illustrating gain versus frequency characteristic of the amplifying circuit when said one of the transistors conducts while said other one of the transistors is in various conditions.

Referring to FIGS. 3, 5 and 8, FIG. 8 illustrates simulated gain of the amplifying circuit 2 under a circumstance where the voltage of the control signal (S1) is 2 V (i.e., the transistor 223 conducts), where the voltage (VS2) of the control signal (S2) is 0 V, 1.3 V, 1.6 V or 2 V (i.e., the transistor 235 is in one of the four different conditions), and where the frequency of the input signal (Sri) is within the range of from 16 GHz to 28 GHz. It can be reasonably determined from FIGS. 5 and 8 that, at a specific value of the voltage (VS2) of the control signal (S2) and a specific value of the frequency of the input signal (Sri), the gain of the amplifying circuit 2 is much smaller when the voltage of the control signal (S1) is 2 V than when the voltage of the control signal (S1) is 0 V. In addition, the gain of the amplifying circuit 2 can be coarsely adjusted by switching the voltage of the control signal (S1) between 2 V and 0 V (i.e., switching the transistor 223 between conduction and non-conduction), and can be finely adjusted by changing the voltage of the control signal (S2) (i.e., changing the resistance provided by the transistor 235), so as to fall within a range having a large span. When the frequency of the input signal (Sri) is 20 GHz, the gain of the amplifying circuit 2 is within a range of from −9.4 dB to 22 dB (i.e., having a span of 31.4 dB).

Figure 9:
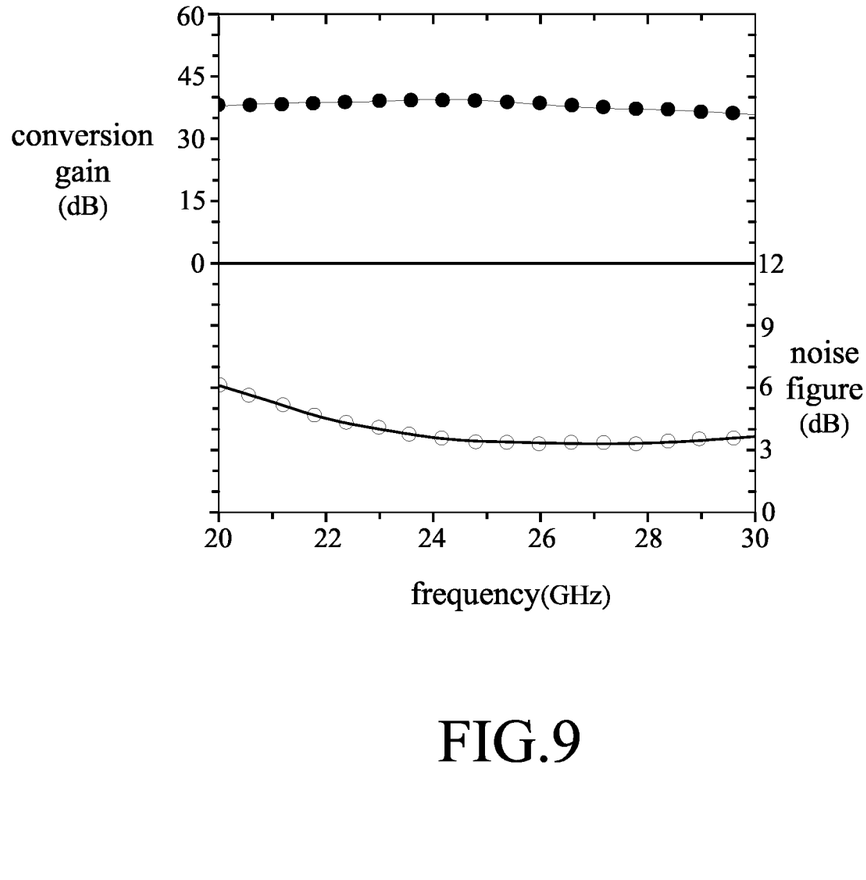
FIG. 9 is a plot illustrating conversion gain versus frequency characteristic and noise figure versus frequency characteristic of the embodiment.

Referring to FIGS. 3 and 9, FIG. 9 illustrates simulated conversion gain and simulated noise figure of the down-conversion mixer of this embodiment under a circumstance where none of the transistors 223, 235 conducts, and where the frequency of the input signal (Sri) is within a range of from 20 GHz to 30 GHz. It can be reasonably determined from FIG. 9 that, when none of the transistors 223, 235 conducts, the gain of the down-conversion mixer of this embodiment is high and the noise figure of the down-conversion mixer of this embodiment is low. When the frequency of the input signal (Sri) is 28 GHz, the gain and the noise figure of the down-conversion mixer of this embodiment are respectively 37.5 dB and 3.3 dB.

Referring back to FIGS. 2, 3 and 4, the down-conversion mixer of this embodiment has the following advantages.

1. Since the conversion gain and the noise figure of the down-conversion mixer vary according to the control voltage (Vc) and the resistance of each of the variable resistors 693, 694, one can adjust the control voltage (Vc) and the resistance of each of the variable resistors 693, 694 to change the conversion gain and the noise figure of the down-conversion mixer.

2. Since each of the resistors 215, 224, 225, 236, 238, 503, 531-534, 63, 64 is coupled between the drain and bulk terminals of the corresponding one of the transistors 211, 222, 223, 234, 235, 502, 521-524, 61, 62, a voltage at the bulk terminal of each of the transistors 211, 222, 223, 234, 235, 502, 521-524 would be greater than a voltage at the source terminal of the transistor, a voltage at the bulk terminal of each of the transistors 61, 62 would be smaller than a voltage at the source terminal of each of the transistors 61, 62, and a threshold voltage of each of the transistors 211, 222, 223, 234, 235, 502, 521-524, 61, 62 would be smaller as compared to a circumstance where the voltage at the bulk terminal of the transistor is equal to the voltage at the source terminal of the transistor. In addition, if each of the resistors 215, 224, 225, 236, 238, 503, 531-534, 63, 64 has a large resistance (e.g., being within a range of from 3 kΩ) to 10 kΩ)), a body leakage current of each of the transistors 211, 222, 223, 234, 235, 502, 521-524, 61, 62, if any, would be nearly zero. Therefore, the power supply voltage (VDD) can be low, and the issue of the leakage current can be alleviated, thereby resulting in low power consumption of the down-conversion mixer.

3. In direct current (DC) analysis of the down-conversion mixer, each of the inductive transmission lines 529, 530 has a zero impedance, and each of the capacitors 501 of the first and second transconductance units 511, 512 has an infinite impedance, so the transconductance circuit 51 and a combination of the mixing circuit 52 and the load circuit 6 can be respectively powered by two separate power supply voltages, instead of by the same power supply voltage (VDD). A current corresponding to the power supply voltage for powering the combination of the mixing circuit 52 and the load circuit 6 first flows through a combination of the transistors 61, 62, then flows through a combination of the transistors 521-524, and finally flows through a combination of the inductive transmission lines 529, 530 to ground, so the power supply voltage for powering the combination of the mixing circuit 52 and the load circuit 6 only has to be sufficient to ensure that each of the transistors 521-524, 61, 62 operates in a predetermined mode, and can be lowered to result in low power consumption of the down-conversion mixer. The power supply voltage for powering the transconductance circuit 51 only has to be sufficient to ensure that each of the transistors 502 of the first and second transconductance units 511, 512 operates in a predetermined mode, and can be lowered to result in low power consumption of the down-conversion mixer.

4. In alternating current (AC) analysis of the down-conversion mixer of this embodiment, each of the first to third amplifiers 21-23 is a common-source amplifier, and the first to third amplifiers 21-23 are cascaded, so the amplifying circuit 2 is a three-stage amplifying circuit. In AC analysis of the conventional down-conversion mixer as shown in FIG. 1, a transistor (M1) of the amplifying circuit 11 is related to a common-source amplifier, and another two transistors (M2, M3) of the amplifying circuit 11 are related to a cascode amplifier, so the amplifying circuit 11 is a two-stage amplifying circuit. Therefore, the gain of the amplifying circuit 2 of this embodiment can be higher than the gain of the amplifying circuit 11 of the conventional down-conversion mixer.

5. The down-conversion mixer of this embodiment has good (i.e., small) sensitivity. The sensitivity of the down-conversion mixer of this embodiment is a minimum input power of the amplifying circuit 2 (i.e., a minimum power of the input signal (Sri)), at which the down-conversion mixer of this embodiment can still operate properly, and is positively correlated to the noise figure of the down-conversion mixer of this embodiment. At the same power consumption, as compared to the conventional down-conversion mixer, the conversion gain of the down-conversion mixer of this embodiment is high, and therefore the noise figure of the down-conversion mixer of this embodiment is low and the sensitivity of the down-conversion mixer of this embodiment is good (i.e., small).

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A down-conversion mixer comprising:
   a converting-and-mixing circuit to receive a differential input voltage signal pair and a differential oscillatory voltage signal pair, and performing voltage to current conversion upon the differential input voltage signal pair and mixing the differential input voltage signal pair with the differential oscillatory voltage signal pair, so as to generate a differential mixed current signal pair; and
   a load circuit having a first terminal and a second terminal that are coupled to said converting-and-mixing circuit to cooperatively receive the differential mixed current signal pair, and converting the differential mixed current signal pair into a differential mixed voltage signal pair that is provided at said first and second terminals of said load circuit, said load circuit including
      a first transistor and a second transistor, each having a first terminal that is to receive a power supply voltage, a second terminal that is coupled to a respective one of said first and second terminals of said load circuit, a third terminal, a control terminal that is to receive a control voltage, and a transconductance that varies according to the control voltage,
      a first resistor and a second resistor, each coupled between said second and third terminals of a respective one of said first and second transistors, and
      a resistor-inductor (RL) circuit coupled between said second terminals of said first and second transistors.

2. The down-conversion mixer of claim 1, wherein:
   said load circuit further includes
      a first capacitor coupled between said control terminal of said first transistor and said second terminal of said second transistor,
      a second capacitor coupled between said control terminal of said second transistor and said second terminal of said first transistor, and
      a third resistor and a fourth resistor, each having a first terminal that is to receive the control voltage, and a second terminal that is coupled to said control terminal of a respective one of said first and second transistors; and
   said RL circuit includes
      a first inductor and a second inductor, each having a first terminal that is coupled to said second terminal of a respective one of said first and second transistors, and a second terminal, and
      two variable resistors coupled in series between said second terminals of said first and second inductors.

3. The down-conversion mixer of claim 1, wherein said converting-and-mixing circuit includes:
   a transconductance circuit to receive the differential input voltage signal pair, and converting the differential input voltage signal pair into a differential input current signal pair; and
   a mixing circuit to receive the differential oscillatory voltage signal pair, coupled to said transconductance circuit to receive the differential input current signal pair, and further coupled to said first and second terminals of said load circuit, said mixing circuit mixing the differential input current signal pair with the differential oscillatory voltage signal pair to generate the differential mixed current signal pair for receipt by said load circuit.

4. The down-conversion mixer of claim 3, wherein:
   the differential input voltage signal pair includes a first input voltage signal and a second input voltage signal;
   the differential input current signal pair includes a first input current signal that is in-phase with the first input voltage signal, and a second input current signal that is in-phase with the second input voltage signal; and
   said transconductance circuit includes
      a first transconductance unit coupled to said mixing circuit, to receive the first input voltage signal, and converting the first input voltage signal into the first input current signal for receipt by said mixing circuit,
      a second transconductance unit coupled to said mixing circuit, to receive the second input voltage signal, and converting the second input voltage signal into the second input current signal for receipt by said mixing circuit, and
      a first inductor coupled between said first and second transconductance units, and to receive the power supply voltage.

5. The down-conversion mixer of claim 4, wherein each of said first and second transconductance units includes:
   a capacitor having a first terminal that is coupled to said mixing circuit and that provides a corresponding one of the first and second input current signals, and a second terminal that is coupled to said first inductor;
   a third transistor having a first terminal that is coupled to said second terminal of said capacitor, a second terminal, a third terminal, and a control terminal that is to receive a corresponding one of the first and second input voltage signals;
   a third resistor coupled between said first and third terminals of said third transistor; and
   a second inductor coupled between said second terminal of said third transistor and ground.

6. The down-conversion mixer of claim 3, wherein:
   said mixing circuit has a first terminal and a second terminal that are coupled to said transconductance circuit to cooperatively receive the differential input current signal pair, a third terminal and a fourth terminal that are to cooperatively receive the differential oscillatory voltage signal pair, and a fifth terminal and a sixth terminal that are respectively coupled to said first and second terminals of said load circuit and that cooperatively provide the differential mixed current signal pair; and
   said mixing circuit includes
      a third transistor having a first terminal that is coupled to said fifth terminal of said mixing circuit, a second terminal, a third terminal, and a control terminal that is coupled to said third terminal of said mixing circuit,
a fourth transistor having a first terminal that is coupled to said sixth terminal of said mixing circuit, a second terminal, a third terminal, and a control terminal that is coupled to said fourth terminal of said mixing circuit,
a fifth transistor having a first terminal that is coupled to said fifth terminal of said mixing circuit, a second terminal, a third terminal, and a control terminal that is coupled to said fourth terminal of said mixing circuit,
a sixth transistor having a first terminal that is coupled to said sixth terminal of said mixing circuit, a second terminal, a third terminal, and a control terminal that is coupled to said third terminal of said mixing circuit,
a first inductor and a second inductor, each coupled between said second terminal of a respective one of said third and fourth transistors and said first terminal of said mixing circuit,
a third inductor and a fourth inductor, each coupled between said second terminal of a respective one of said fifth and sixth transistors and said second terminal of said mixing circuit,
a first inductive transmission line and a second inductive transmission line, each coupled between a respective one of said first and second terminals of said mixing circuit and ground, and
a third resistor, a fourth resistor, a fifth resistor and a sixth resistor, each coupled between said first and third terminals of a respective one of said third to sixth transistors.

7. The down-conversion mixer of claim 1, further comprising:
an amplifying circuit to receive an input signal, and amplifying the input signal to generate a single-ended input voltage signal; and
a first single-ended to differential converting circuit coupled to said amplifying circuit to receive the single-ended input voltage signal, further coupled to said converting-and-mixing circuit, and converting the single-ended input voltage signal into the differential input voltage signal pair for receipt by said converting-and-mixing circuit.

8. The down-conversion mixer of claim 7, wherein said amplifying circuit includes:
a first amplifier to receive the input signal, and amplifying the input signal to generate a first amplified signal;
a second amplifier coupled to said first amplifier to receive the first amplified signal, and amplifying the first amplified signal to generate a second amplified signal; and
a third amplifier coupled to said second amplifier to receive the second amplified signal, further coupled to said single-ended to differential converting circuit, and amplifying the second amplified signal to generate the single-ended input voltage signal for receipt by said single-ended to differential converting circuit.

9. The down-conversion mixer of claim 8, wherein said first amplifier includes:
an inductor having a first terminal that is to receive the input signal, and a second terminal that is to receive a bias voltage;
a third transistor having a first terminal, a second terminal, a third terminal, and a control terminal that is coupled to said second terminal of said inductor;
a first inductive transmission line coupled between said second terminal of said third transistor and ground;
a third resistor coupled between said first and third terminals of said third transistor;
a second inductive transmission line having a first terminal, and a second terminal that is coupled to said first terminal of said third transistor;
a third inductive transmission line having a first terminal that is to receive the power supply voltage, and a second terminal that is coupled to said first terminal of said second inductive transmission line; and
a capacitor having a first terminal that is coupled to said first terminal of said second inductive transmission line, and a second terminal that is coupled to said second amplifier and that provides the first amplified signal.

10. The down-conversion mixer of claim 8, wherein said second amplifier includes:
an inductive transmission line having a first terminal that is coupled to said first amplifier to receive the first amplified signal, and a second terminal that is to receive a bias voltage;
a third transistor having a first terminal that is coupled to said third amplifier and that provides the second amplified signal, a second terminal that is coupled to ground, a third terminal, and a control terminal that is coupled to said second terminal of said inductive transmission line;
a capacitor having a first terminal that is coupled to said first terminal of said third transistor, and a second terminal;
a fourth transistor having a first terminal that is coupled to said second terminal of said capacitor, a second terminal that is coupled to ground, a third terminal, and a control terminal that is to receive a control signal; and
a third resistor and a fourth resistor, each coupled between said first and third terminals of a respective one of said third and fourth transistors.

11. The down-conversion mixer of claim 8, wherein said third amplifier includes:
a first inductive transmission line having a first terminal, and a second terminal that is coupled to said second amplifier to receive the second amplified signal;
a third transistor having a first terminal, a second terminal that is coupled to said first terminal of said first inductive transmission line, a third terminal, and a control terminal;
a second inductive transmission line having a first terminal, and a second terminal that is coupled to said control terminal of said third transistor;
a capacitor coupled between said first terminal of said second inductive transmission line and said second terminal of said first inductive transmission line;
a third inductive transmission line having a first terminal that is to receive the power supply voltage, and a second terminal that is coupled to said first terminal of said third transistor;
a third resistor coupled between said first terminal of said second inductive transmission line and said first terminal of said third transistor;
a fourth inductive transmission line having a first terminal that is coupled to said first terminal of said third transistor, and a second terminal that is coupled to said first single-ended to differential converting circuit and that provides the single-ended input voltage signal;

a fourth transistor having a first terminal that is coupled to said first terminal of said third transistor, a second terminal that is coupled to said first terminal of said first inductive transmission line, a third terminal, and a control terminal that is to receive a control signal; and a fourth resistor and a fifth resistor, each coupled between said first and third terminals of a respective one of said third and fourth transistors.

12. The down-conversion mixer of claim 7, further comprising:

a second single-ended to differential converting circuit coupled to said converting-and-mixing circuit, to receive a single-ended oscillatory voltage signal, and converting the single-ended oscillatory voltage signal into the differential oscillatory voltage signal pair for receipt by said converting-and-mixing circuit.

13. The down-conversion mixer of claim 1, further comprising:

a buffering circuit coupled to said first and second terminals of said load circuit to receive the differential mixed voltage signal pair, and buffering the differential mixed voltage signal pair to generate a differential output voltage signal pair;

wherein the differential mixed voltage signal pair includes a first mixed voltage signal and a second mixed voltage signal;

wherein the differential output voltage signal pair includes a first output voltage signal and a second output voltage signal;

wherein said buffering circuit includes a third transistor and a fourth transistor, each having a first terminal that is to receive the power supply voltage, a second terminal, and a control terminal that is coupled to a respective one of said first and second terminals of said load circuit to receive a respective one of the first and second mixed voltage signals, a fifth transistor and a sixth transistor, each having a first terminal that is coupled to said second terminal of a respective one of said third and fourth transistors, a second terminal, and a control terminal that is to receive a bias voltage, and a third resistor and a fourth resistor, each coupled between said second terminal of a respective one of said fifth and sixth transistors and ground, each of the first and second output voltage signals being provided at said second terminal of a respective one of said third and fourth transistors.

* * * * *